United States Patent
Wang et al.

(10) Patent No.: US 11,055,021 B2
(45) Date of Patent: Jul. 6, 2021

(54) RESISTIVE MEMORY

(71) Applicant: Winbond Electronics Corp., Taichung (TW)

(72) Inventors: Ping-Kun Wang, Tianzhong Township, Changhua County (TW); Shao-Ching Liao, Tongluo Township, Miaoli County (TW); Chien-Min Wu, Hsinchu (TW); Chia Hua Ho, Hsinchu (TW); Frederick Chen, Tainan (TW); He-Hsuan Chao, Hsinchu (TW); Seow-Fong Lim, Fremont, CA (US)

(73) Assignee: WINBOND ELECTRONICS CORP., Taichung (TW)

( * ) Notice: Subject to any disclaimer, the term of this patent is extended or adjusted under 35 U.S.C. 154(b) by 26 days.

(21) Appl. No.: 16/353,339

(22) Filed: Mar. 14, 2019

(65) Prior Publication Data

US 2019/0369920 A1    Dec. 5, 2019

(30) Foreign Application Priority Data

May 29, 2018    (TW) .................................. 107118282

(51) Int. Cl.
*G06F 3/06* (2006.01)
*G06F 11/07* (2006.01)
*G11C 13/00* (2006.01)

(52) U.S. Cl.
CPC .......... *G06F 3/0659* (2013.01); *G06F 3/0604* (2013.01); *G06F 3/0673* (2013.01);
(Continued)

(58) Field of Classification Search
CPC ............................ G06F 3/0659; G06F 11/076
See application file for complete search history.

(56) References Cited

U.S. PATENT DOCUMENTS

| 2011/0299334 | A1* | 12/2011 | Honma .............. G11C 16/3454 365/185.03 |
| 2013/0250654 | A1 | 9/2013 | Sugimae et al. |

(Continued)

FOREIGN PATENT DOCUMENTS

| TW | 280912 B | 7/1996 |
| TW | 201230035 A | 7/2012 |

OTHER PUBLICATIONS

Daniele Ielmini, Resistive switching memories based on metal oxides: mechanisms, reliability, and scaling, Semiconductor Science and Technology, 2016, vol. 31, IOP Publishing Ltd., 25 pages.

*Primary Examiner* — David E Martinez
(74) *Attorney, Agent, or Firm* — Muncy, Geissler, Olds & Lowe, P.C.

(57) ABSTRACT

A resistive memory including a storage array, a storage circuit, a control circuit, a voltage generation circuit and an access circuit is provided. The storage array includes a plurality of blocks. Each block includes a plurality of memory cells. The storage circuit stores a plurality of count values. Each of the count values indicates the number of times that a corresponding block performs a write operation. The control circuit generates a control signal according to the count values when an external command is a write command. The voltage generation circuit provides an operation voltage group according to the control signal. The access circuit accesses the storage array according to the operation voltage group.

7 Claims, 3 Drawing Sheets

(52) U.S. Cl.
CPC ...... *G11C 13/0038* (2013.01); *G11C 13/0069* (2013.01); *G11C 2013/009* (2013.01)

(56) References Cited

U.S. PATENT DOCUMENTS

| | | | |
|---|---|---|---|
| 2016/0078911 A1* | 3/2016 | Fujiwara | G11C 7/109 365/189.2 |
| 2016/0099052 A1 | 4/2016 | Lee et al. | |
| 2019/0056888 A1* | 2/2019 | Kwon | G06F 3/064 |

* cited by examiner

RESISTIVE MEMORY

CROSS REFERENCE TO RELATED APPLICATIONS

This Application claims priority of Taiwan Patent Application No. 107118282, filed on May 29, 2018, the entirety of which is incorporated by reference herein.

BACKGROUND OF THE INVENTION

Field of the Invention

The invention relates to a storage device, and more particularly to a resistive memory.

Description of the Related Art

Non-volatile memory has an advantage wherein stored data will not disappear after a power-off event. Therefore, non-volatile memory is an essential component of electronic products to maintain normal operation. Currently, the resistive random-access memory is a non-volatile memory actively developed in the industry. Resistive random-access memory possesses the favorable advantages of having a low write operation voltage, a short write erasing time, a long saving time, non-destructive reading, multi-state storage, a simple structure, and a small size. Therefore, resistive random-access memory has great potential for future application in personal computers and electronic products.

Generally, resistive random-access memory needs an obvious sense window to provide obvious data discrimination. A conventional method is to apply a high reset voltage to generate an obvious sense window in the reset operation. However, the conventional method increases the degradation speed of the resistive random-access memory and reduces the endurance of the resistive random-access memory.

BRIEF SUMMARY OF THE INVENTION

In accordance with an embodiment, a resistive memory comprises a storage array, a storage circuit, a control circuit, a voltage generation circuit, and an access circuit. The storage array comprises a plurality of blocks. Each block comprises a plurality of memory cells. The storage circuit stores a plurality of count values. Each of the count values indicates the number of times that a corresponding block performs a write operation. The control circuit generates a control signal according to the count values when an external command is a write command. The voltage generation circuit provides an operation voltage group according to the control signal. The access circuit accesses the storage array according to the operation voltage group.

A write method for a resistive memory is provided. The resistive memory comprises a storage array, a control circuit and an access circuit. The control circuit receives an external command to activate the access circuit to access the storage array. The storage array comprises a plurality of blocks. An exemplary embodiment of the write method comprises determining whether the external command is ready to perform a write operation for the storage array; generating a first operation voltage group to the access circuit when the external command does not perform the write operation for the storage array; reading a count value of a block that corresponds to a write address when the external command performs the write operation for the storage array, wherein the count value indicates the number of times that the block corresponding to the write address performs the write operation; and generating a second operation voltage group to the access circuit according to the count value of the block corresponding to the write address.

According to the above description, the resistive memory and the write method provide different operation voltage groups as the number of times that the resistive memory performs a write operation increases. Therefore, the resistive memory has an obvious sense window, and simultaneously, the degradation speed of the resistive memory is reduced.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The present invention will be described with respect to particular embodiments and with reference to certain drawings.

Figure 1:
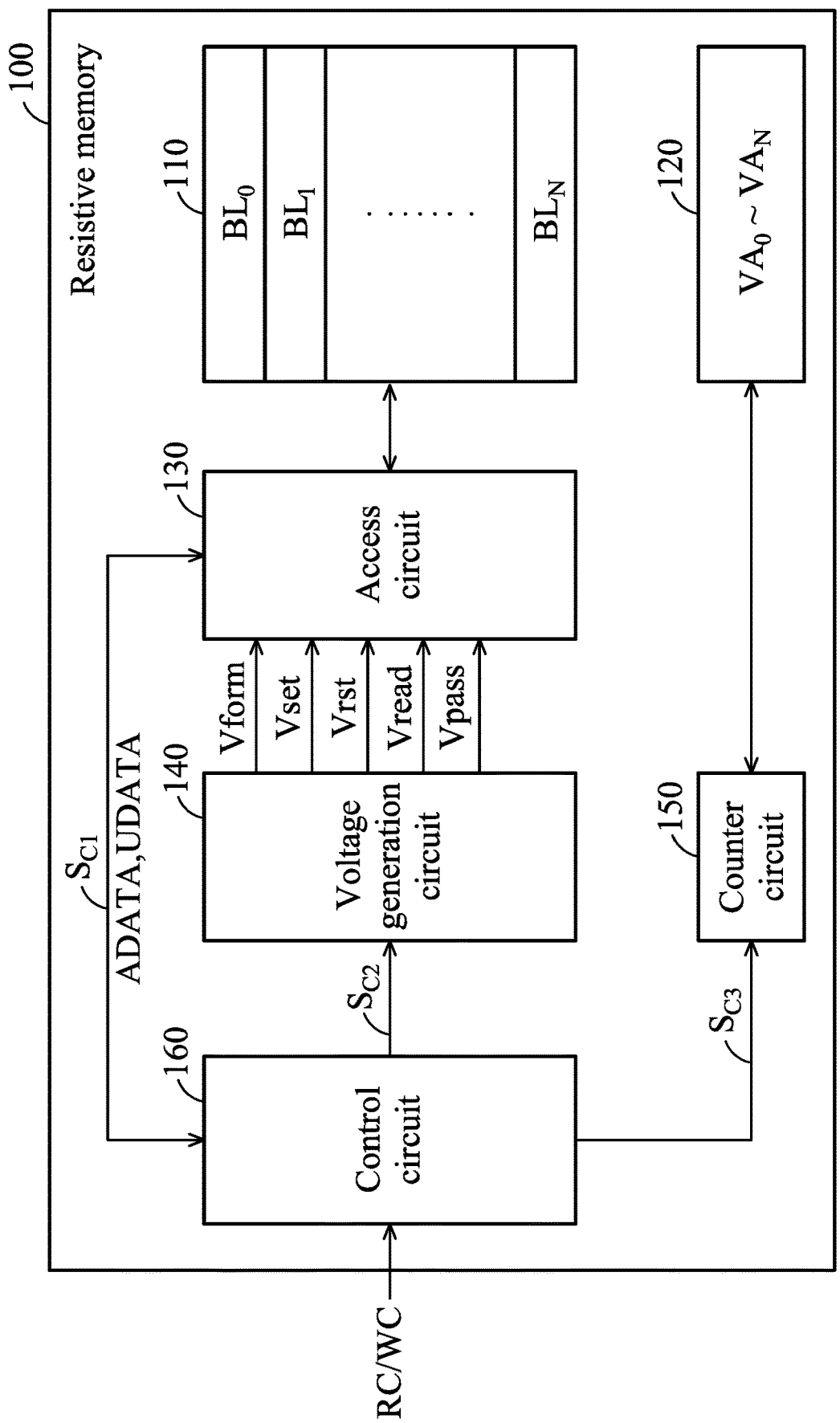
FIG. 1 is a schematic diagram of an exemplary embodiment of a resistive memory according to various aspects of the present disclosure.

FIG. 1 is a schematic diagram of an exemplary embodiment of a resistive memory according to various aspects of the present disclosure. The resistive memory 100 comprises a storage array 110, a storage circuit 120, an access circuit 130, a voltage generation circuit 140, a counter circuit 150 and a control circuit 160.

The storage array 110 comprises a plurality of memory cells arranged into a matrix. In the present disclosure, the memory cells are divided into a plurality of blocks $BL_0 \sim BL_N$. The number of the memory cells in one block may be the same as or different from the number of the memory cells in another block. For example, each of the blocks $BL_0 \sim BL_N$ comprises thirty-two memory cells, but the disclosure is not limited thereto. In other embodiments, each of the blocks $BL_0 \sim BL_N$ has more or fewer memory cells.

The control circuit 160 receives different external commands and generates control signals $S_{C1} \sim S_{C1}$ to control each circuit of the resistive memory and access the storage array 110. For example, when an external command is a read command RC, the control circuit 160 generates a plurality of control signals $S_{C1} \sim S_{C3}$ according to the read command RC to read the memory cells of the storage array 110 to output read data. However, when the external command is a write command WC, the control circuit 160 generates a plurality of control signals $S_{C1} \sim S_{C3}$ according to the write command WC so that user data is written to the storage array 110.

The access circuit 130 accesses the storage array 110 according to the control signal $S_{C1}$ and an operation voltage group. In one embodiment, when the control circuit 160 receives a read command RC, the control circuit 160 provides a control signal $S_{C1}$ to the access circuit 130. The access circuit 130 reads original data ADATA stored in at least one memory cell of the storage array 110 according to the control signal $S_{C1}$ and a read voltage group Vread. The access circuit 130 provides the original data ADATA to the control circuit 160. How the access circuit 130 reads the original data ADATA stored in the storage array 110 is not limited in the present disclosure. In some embodiments, the access circuit 130 is capable of determining the value (e.g. data "0" or data "1") of the original data ADATA according to the current passing through the memory cell of the storage array 110 or the resistance of the memory cell of the storage array 110.

In another embodiment, when the control circuit 160 receives a write command, the control circuit 160 provides a control signal $S_{C1}$ to the access circuit 130. The access circuit 130 may perform a set operation, a reset operation or a pass operation for at least one memory cell of the storage array 110 according to the control signal $S_{C1}$. Assume that data is written to a memory cell of the block $BL_N$. When the access circuit 130 performs a set operation to write data "0", the access circuit 130 writes user data UDATA to a memory cell of the block $BL_N$ according to the control signal $S_{C1}$ and a set voltage group Vset. After the set operation, the memory cell is in a low resistance state (LRS). However, when the access circuit 130 performs a reset operation to write data "1", the access circuit 130 writes user data UDATA to a memory cell of the block $BL_N$ according to the control signal $S_{C1}$ and a reset voltage group Vrst. After the reset operation, the memory cell is in a high resistance state (HRS). In another embodiment, the access circuit 130 may perform a pass operation. In this case, the access circuit 130 performs the pass operation for a memory cell of the block $BL_N$ according to the control signal $S_{C1}$ and a pass voltage group Vpass. After the pass operation, the data stored in the memory cell is not changed.

In other embodiments, when the control circuit 160 receives a write command WC, the control circuit 160 first reads the original data ADATA corresponding to a write address and compares the original data ADATA with the user data UDATA to generate a comparison result. The control circuit 160 writes the user data UDATA according to the comparison result. In particular, when the control circuit 160 receives a write command WC, the control circuit 160 first provides a control signal $S_{C1}$. The access circuit 130 reads original data ADATA stored in at least one memory cell of the storage array 110 according to the control signal $S_{C1}$ and a read voltage group Vread and then provides the original data ADATA to the control circuit 160. The control circuit 160 compares the original data ADATA and user data UDATA to generate a comparison result. The control circuit 160 generates new control signal $S_{C1}$ according to the comparison result to direct the access circuit 130 to perform a set operation, a reset operation or a pass operation. When the original data ADATA is the data "1" and the user data UDATA is the data "0", the control circuit 160 controls the access circuit 130 to perform a set operation to write the data "0" according to the comparison result. When the original data ADATA is the data "0" and the user data UDATA is the data "1", the control circuit 160 controls the access circuit 130 to perform a reset operation to write the data "1" according to the comparison result. When the access circuit 130 performs the set operation or the reset operation for the memory cell corresponding to a write address according to the control signal $S_{C1}$, the access circuit 130 performs a pass operation for other memory cells of the storage array 110 according to the control signal $S_{C1}$.

In one embodiment, if the user data UDATA has many bits (e.g. 8 bits), after the control circuit 160 compares the original data ADATA and the user data UDATA, the control circuit 160 may determine that a set operation is performed to write the data "0" to a first memory cell group of the storage array 110 and a reset operation is performed to write the data "1" to a second memory cell group of the storage array 110, wherein each of the first and second memory cell groups has at least one memory cell. In this case, the control circuit 160 may first control the access circuit 130 to perform a set operation for the first memory cell group and then control the access circuit 130 to perform a reset operation for the second memory cell group. In other embodiments, the control circuit 160 may first control the access circuit 130 to perform a reset operation for the second memory cell group and then control the access circuit 130 to perform a set operation for the first memory cell group.

The circuit structure of the access circuit 130 is not limited in the present disclosure. In one embodiment, the access circuit 130 comprises an address selection circuit (not shown). The address selection circuit selects at least one memory cell of the storage array 110 according to the control signal $S_{C1}$. In such cases, the address selection circuit may comprise a column address decoder (not shown) and a row address decoder (not shown).

Additionally, the circuit structure of the control circuit 160 is not limited in the present disclosure. In one embodiment, the control circuit 160 comprises a verification circuit (not shown) configured to provide a verification current to the access circuit 130. In this case, the access circuit 130 applies the verification current to the memory cell corresponding to the write address and determines the original data ADATA stored in the memory cell is the data "0" or the data "1" according to the current passing through the memory cell or the resistance of the memory cell. Then, the control circuit 160 compares the original data ADATA with the user data UDATA to determine whether to perform a set operation or a reset operation to write the data "0" or the data "1" to the memory cell.

The storage circuit 120 is configured to store the count values $VA_0$~$VA_N$ that indicate how many times a write operation has been performed in the blocks $BL_0$~$BL_N$. For example, the count value $VA_0$ indicates the number of times that the write operation has been performed in the block $BL_0$, and the count value $VA_N$ indicates the number of times that the write operation has been performed in the block $BL_N$. The circuit structure of the storage circuit 120 is not limited in the present disclosure. In one embodiment, the storage circuit 120 is a memory independent of the memory cell 110. In other embodiments, the storage circuit 120 is a portion of the memory cell 110.

The counter circuit 150 adjusts the count values $VA_0$~$VA_N$ stored in the storage circuit 120 according to the control signal $S_{C3}$. In particular, when the control circuit 160 receives a write command WC, the control circuit 160 provides the control signal $S_{C3}$ to the counter circuit 150. The counter circuit 150 adjusts the count value (e.g. $VA_N$) corresponding the block (e.g. $BL_N$) corresponding to a write address according to the control signal $S_{C3}$. The circuit structure of the counter circuit 150 is not limited in the present disclosure. In one embodiment, the counter circuit 150 may comprise an accumulator (not shown). In another embodiment, the counter circuit 150 may further comprise a register (not shown) configured to store the count values $VA_0$~$VA_N$ read from the storage circuit 120. In this case, the counter circuit 150 first reads the counter value (e.g. $VA_N$) corresponding to the block (e.g. $BL_N$) corresponding to a write address and stores the counter value to the register. Then, the counter circuit 150 adjusts the counter value stored in the register. The counter circuit 150 stores the data of the register to the storage circuit 120 before or after the write operation is performed. In some embodiments, the counter circuit 150 is capable of integrating to the control circuit 160. In this case, the control circuit 160 directly adjusts the count values $VA_0 \sim VA_N$ stored in the storage circuit 120 according to the control signal $S_{C3}$.

The voltage generation circuit 140 generates a corresponding operation voltage group according to the control signal $S_{C2}$. For example, the operation voltage group may be a read voltage group Vread, a set voltage group Vset, a reset voltage group Vrst, a pass voltage group Vpass or a forming voltage group Vform, but the disclosure is not limited thereto. Any voltage which is utilized to access the storage array 110 can be generated by the voltage generation circuit 140.

In this embodiment, before the control circuit 160 directs the access circuit 130 to perform a reset operation or a set operation to the storage array 110, the control circuit 160 first provides the control signal $S_{C2}$ based on the count value (e.g. $VA_N$) of the corresponding block (e.g. $BL_N$) in accordance with a write address. The voltage generation circuit 140 generates a corresponding operation voltage group (e.g. a reset voltage group Vrst or a set voltage group Vset) according to the control signal $S_{C2}$.

In one embodiment, the control circuit 160 compares the count value (e.g. $VA_N$) with a first threshold value to generate a comparison result and generates the control signal $S_{C2}$ according to the comparison result. In particular, when the count value is lower than the first threshold value, the control circuit 160 sets an electrical feature (e.g. frequency or voltage level) of the control signal $S_{C2}$ to a first predetermined value. However, when the count value is higher than or equal to the first threshold value, the control circuit 160 sets the electrical feature of the control signal $S_{C2}$ to a second predetermined value.

In some embodiment, when the count value (e.g. $VA_N$) is higher than the first threshold value, the control circuit 160 continuously compares the count value with a second threshold value to generate a comparison result and generates the control signal $S_{C2}$ according to the comparison result. In particular, when the count value is higher than the first threshold value and lower than the second threshold value, the control circuit 160 sets the electrical feature of the control signal $S_{C2}$ to a second predetermined value. However, when the count value is higher than or equal to the second threshold value, the control circuit 160 sets the electrical feature of the control signal $S_{C2}$ to a third predetermined value.

In this embodiment, to slow down the degradation of the resistive memory, when the operation voltage group is provided as a reset voltage group Vrst, the electrical feature of the control signal $S_{C2}$ is gradually changed with increases of the count values $VA_0 \sim VA_N$. In one embodiment, the second predetermined value is substantially lower than the first predetermined value, and the third predetermined value is substantially lower than the second predetermined value, and so on. For example, in one embodiment, since the second predetermined value is lower than the first predetermined value, the voltage generation circuit 140 reduces the duration of the generation of the reset voltage group Vrst applied to a memory cell corresponding to the write address. In another embodiment, since the second predetermined value is lower than the first predetermined value, the voltage generation circuit 140 reduces at least one of the word line voltage, the bit line voltage and the source line voltage of the reset voltage group Vrst.

In another embodiment, when the operation voltage group is provided as a set voltage group Vset, the electrical feature of the control signal $S_{C2}$ is gradually changed with increases of the count values $VA_0 \sim VA_N$. In one embodiment, the second predetermined value is substantially higher than the first predetermined value, and the third predetermined value is substantially higher than the second predetermined value, and so on. For example, in one embodiment, since the second predetermined value is higher than the first predetermined value, the voltage generation circuit 140 increases the duration of the generation of the set voltage group Vset applied to the memory cell corresponding to the write address. In another embodiment, since the second predetermined value is higher than the first predetermined value, the voltage generation circuit 140 increases at least one of the word line voltage, the bit line voltage and the source line voltage of the reset voltage group Vrst.

For example, assume that the operation voltage group is provided as the reset voltage group Vrst, and the counter circuit 150 reads the count value $VA_1$. When the count value $VA_1$ does not reach the first threshold value, it means that the number of times that a write operation is performed in the block $BL_1$ is not high. Therefore, the control circuit 160 first sets a specific voltage (e.g. a bit line voltage, a word line voltage or a source line voltage) of the reset voltage group Vrst to a first predetermined voltage (e.g. 3.0V). However, when the count value $VA_1$ reaches the first threshold value, it means that the number of times that a write operation is performed in the block $BL_1$ is high. Therefore, the control circuit 160 sets the specific voltage of the reset voltage group Vrst to a second predetermined voltage (e.g. 2.5V). In other embodiments, the control circuit 160 adjusts the duration when the voltage generation circuit 140 provides the reset voltage group Vrst according to the count value $VA_1$. For example, when the count value $VA_1$ does not reach the first threshold value, the duration when the voltage generation circuit 140 provides the reset voltage group Vrst is equal to a first predetermined time (e.g. 1 ms). When the count value $VA_1$ reaches the first threshold value, the duration when the voltage generation circuit 140 provides the reset voltage group Vrst is equal to a second predetermined time (e.g. 0.1 ms). The second predetermined time is shorter than the first predetermined time.

Furthermore, assume that the operation voltage group is provided as the set voltage group Vset, and the counter circuit 150 reads the count value $VA_1$. When the count value $VA_1$ has not reached the first threshold value, it means that the number of times that a write operation is performed in the block $BL_1$ is not high. Therefore, the control circuit 160 generates the control signal $S_{C2}$ to control the voltage generation circuit 140 so that the specific voltage (e.g. a bit line voltage, a word line voltage or a source line voltage) of the set voltage group Vset is equal to the first predetermined voltage (e.g. 2.5V). However, when the count value $VA_1$ reaches the first threshold value, it means that the number of times that a write operation is performed in the block $BL_1$ is high. Therefore, the control circuit 160 utilizes the control signal $S_{C2}$ to direct the voltage generation circuit 140 to adjust the specific voltage of the set voltage group Vset so that the specific voltage is equal to the second predetermined voltage (e.g. 3.0V). In other embodiments, the control circuit 160 adjusts the duration when the voltage generation circuit 140 provides the set voltage group Vset according to the count value $VA_1$. For example, when the count value $VA_1$ has not reached the threshold value, the duration when the voltage generation circuit 140 provides the set voltage group Vset is equal to a first predetermined time (e.g. 0.1 ms). When the count value $VA_1$ reaches the threshold value, the duration when the voltage generation circuit 140 provides the set voltage group Vset is equal to a second predetermined time (e.g. 1 ms). The second predetermined time is longer than the first predetermined time.

As discussed above, since the control unit 160 is capable of generating different control signals $S_{C2}$ with different electrical feature as the count values $VA_0 \sim VA_N$ increase, the voltage generation circuit 140 is capable of adjusting the operation voltage groups as the control signal $S_{C2}$ changes. For example, the voltage generation circuit 140 reduces the reset voltage group Vrst or increases the set voltage group Vset as the count values $VA_0 \sim VA_N$ increase. Therefore, the degradation speed of the resistive memory 100 is reduced and the endurance of the resistive memory 100 is increased.

How the control circuit 160 compares the count values $VA_0 \sim VA_N$ with different threshold values is not limited in the present disclosure. In one embodiment, the control circuit 160 may comprise a look up table circuit to set the electrical feature of the control signal $S_{C2}$ according to the count values $VA_0 \sim VA_N$. In this case, the look up table circuit may be a non-volatile storage element storing at least one threshold value and a plurality of electrical features. In another embodiment, the control circuit 160 may comprise a comparison logic circuit. The comparison logic circuit is configured to sequentially compare the count values with at least one threshold value to set the electrical feature of the control signal $S_{C2}$. In this case, the comparison logic circuit may comprise at least one volatile storage element, and the at least one threshold value and a plurality of electrical features can be written into the volatile storage element through an option bit.

Additionally, the circuit structure of the voltage generation circuit 140 is not limited in the present disclosure. In one embodiment, the voltage generation circuit 140 comprises a single voltage generator (not shown). The voltage generator generates different operation voltage groups according to an electrical feature (e.g. frequency or voltage level) of the control signal $S_{C2}$. In another embodiment, the voltage generation circuit 140 may comprise a plurality of voltage generators (not shown). In this case, the voltage generators may generate corresponding operation voltage groups according to one or more control signals.

Figure 2:
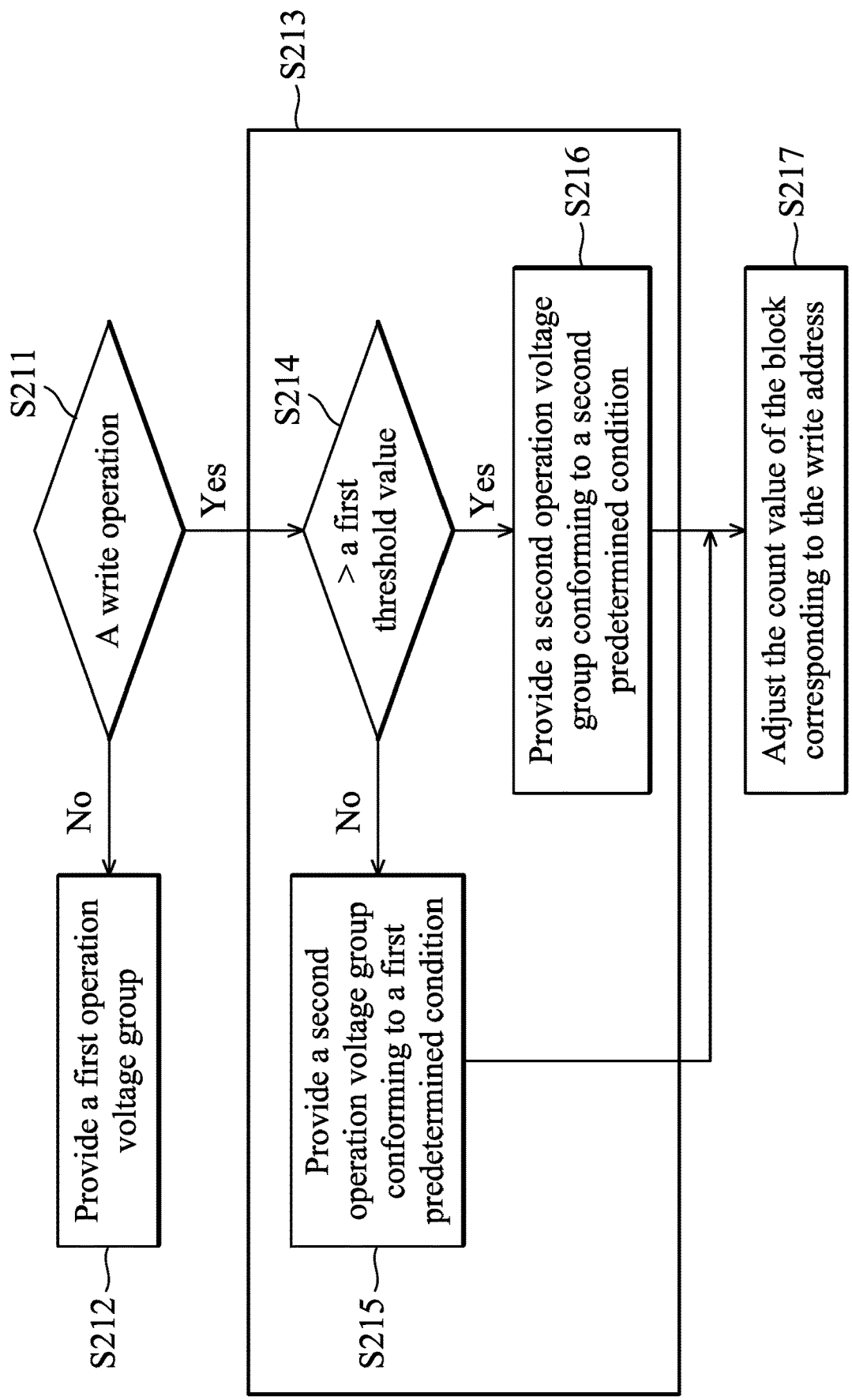
FIG. 2 is a flowchart of an exemplary embodiment of a write method according to various aspects of the present disclosure.

FIG. 2 is a flowchart of an exemplary embodiment of a write method according to various aspects of the present disclosure. The write method of the invention is applied to a resistive memory. The resistive memory comprises a storage array, a control circuit and an access circuit. The control circuit accesses the storage array according to an external command. The access circuit is controlled by the control circuit to access the storage array. The storage array comprises a plurality of blocks. Each of the blocks comprises at least one memory cell. In one embodiment, each block comprises 32 memory cells.

First, a determination is made as to whether an external command intends to perform a write operation for the storage array (step S211). When the external command does not intend to perform a write operation for the storage array, a first operation voltage group is provided to the access circuit (step S212). In one embodiment, when the control circuit receives a read command, the access circuit is controlled by the control circuit and reads data stored in the storage array according to the first operation voltage group. In one embodiment, the first operation voltage group has at least one voltage.

However, when the external command intends to perform a write operation for the storage array, a second operation voltage group is provided to the access circuit according to a count value of a block corresponding to a write address (step S213). In one embodiment, the second operation voltage group has at least one voltage. The access circuit controlled by the control circuit writes data to the memory cell corresponding to the write address according to the second operation voltage group.

In this embodiment, step S213 comprises steps S214~S216. Step S214 determines whether the count value of the block corresponding to the write address is higher than a first threshold value. In one embodiment, the resistive memory comprises a storage circuit configured to record the number of times that the write operation has been performed in each block. Therefore, each block has a corresponding count value. In one embodiment, the storage circuit is independent of the storage array. In another embodiment, the storage circuit may be integrated in the storage array.

When the count value of the block corresponding to the write address is not higher than the first threshold value, a second operation voltage group conforming to a first predetermined condition is provided to the access circuit (step S215). However, when the count value of the block corresponding to the write address is higher than the first threshold value, a second operation voltage group conforming to a second predetermined condition is provided to the access circuit (step S216). In one embodiment, the second operation voltage group is a reset voltage group, and the second operation voltage group conforming to the second predetermined condition is essentially lower than the second operation voltage group conforming to the first predetermined condition. In another embodiment, the second operation voltage group is a set voltage group. In this case, the second operation voltage group conforming to the second predetermined condition is essentially higher than the second operation voltage group conforming to the first predetermined condition. Next, after the write operation is finished, the count value of the block corresponding to the write address is adjusted (step S217). In one embodiment, the control circuit performs the write operation, and simultaneously, the count value of the block corresponding to the write address is adjusted.

For example, assume that the second operation voltage group is provided as a reset voltage group having a word-line voltage, a bit-line voltage and a source-line voltage. When the count value of the block corresponding to the write address is not higher than the first threshold value, the second operation voltage group conforming to the first predetermined condition is provided to the access circuit in step S215. However, when the count value of the block corresponding to the write address is higher than or equal to the first threshold value, the second operation voltage group conforming to the second predetermined condition is provided to the access circuit in step S216. In this case, the second operation voltage group conforming to the second predetermined condition is essentially lower than the second operation voltage group conforming to the first predetermined condition. For example, one (e.g. a bit-line voltage) of the word-line voltage, the bit-line voltage and the source-line voltage constituting the second operation voltage group conforming to the second predetermined condition is lower than the voltage (e.g. the bit-line voltage) constitute the second operation voltage group conforming to the first predetermined condition. In another embodiment, the duration when the second operation voltage group conforming to the second predetermined condition is provided to the access circuit is shorter than the duration when the second operation voltage group conforming to the first predetermined condition is provided to the access circuit. In this embodiment, since the access circuit utilizes the lower second operation voltage group to perform the reset operation, the degradation speed of the resistive memory is reduced and the life of the resistive memory is increased.

Figure 3:
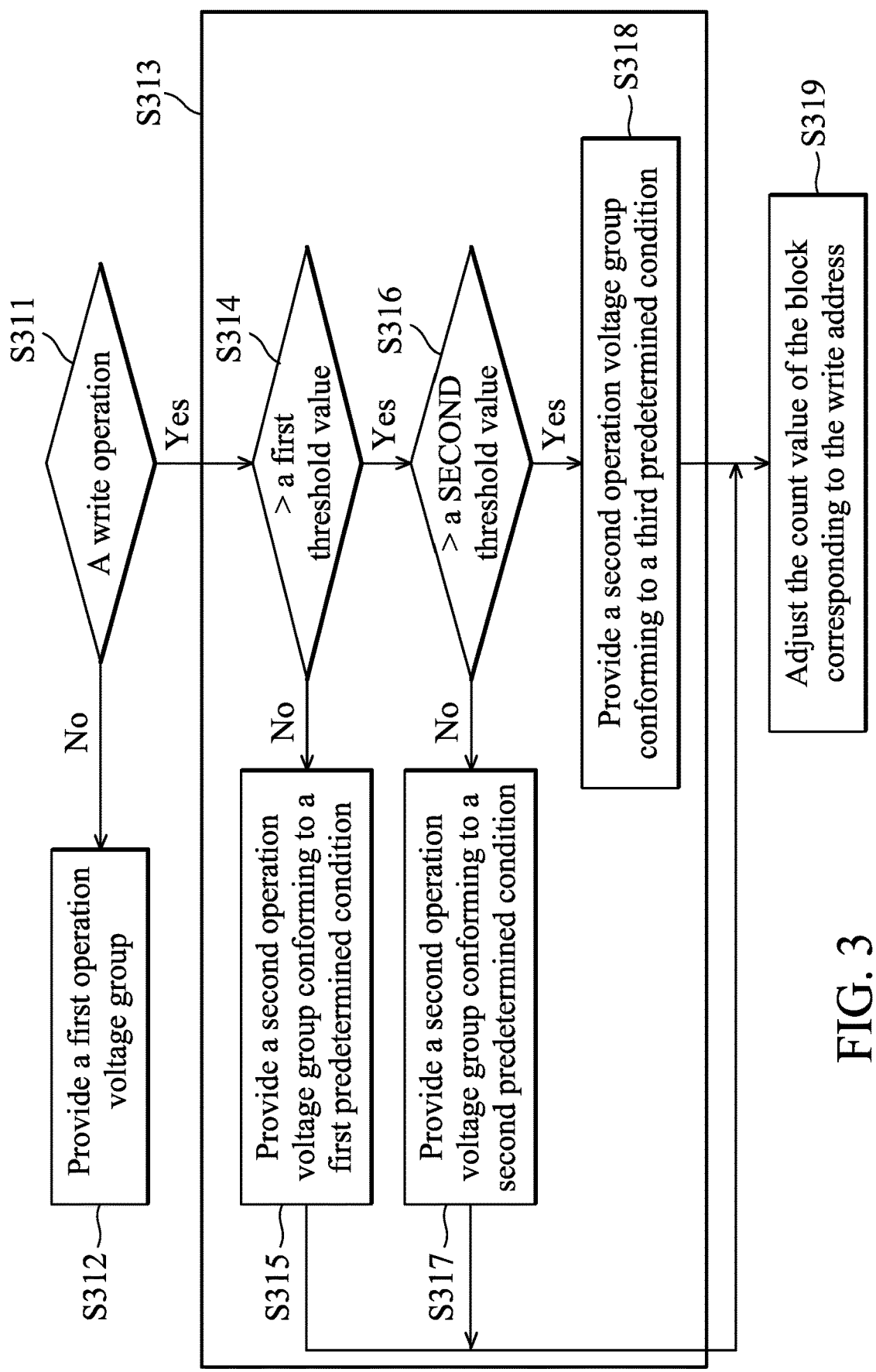
FIG. 3 is a flowchart of another exemplary embodiment of the write method according to various aspects of the present disclosure.

FIG. 3 is a flowchart of another exemplary embodiment of the write method according to various aspects of the present disclosure. In this embodiment, steps S311 and S312 are similar to steps S211 and S212 shown in FIG. 2, the descriptions of steps S311 and S312 are omitted. In this embodiment, step S313 provides the second operation voltage group which may conform different predetermined conditions according to the change of the count value (steps S314~S318).

In particular, in this embodiment, when the count value of the block corresponding to the write address is not higher than the first threshold value, the second operation voltage group conforming to the first predetermined condition is provided to the access circuit (step S315). When the count value of the block corresponding to the write address is higher than the first threshold value, a determination is made as to whether the count value of the block corresponding to the write address is higher than a second threshold value (step S316). When the count value of the block corresponding to the write address is higher than the first threshold value and is not higher than the second threshold value, the second operation voltage group conforming to the second predetermined condition is provided to the access circuit (step S317). However, when the count value of the block corresponding to the write address is higher than the second threshold value, a second operation voltage group conforming to a third predetermined condition is provided to the access circuit (step S318). In one embodiment, the second operation voltage group is provided as a reset voltage group. In this case, the second operation voltage group conforming to the third predetermined condition is essentially lower than the second operation voltage group conforming to the second predetermined condition. In another embodiment, the second operation voltage group is provided as a set voltage group. In this case, the second operation voltage group conforming to the third predetermined condition is essentially higher than the second operation voltage group conforming to the second predetermined condition. Next, after the write operation is finished, the count value of the block corresponding to the write address is adjusted (step S319). In one embodiment, the control circuit performs the write operation, and simultaneously, the count value of the block corresponding to the write address is adjusted.

In the present disclosure, two threshold values are provided as an example, but the disclosure is not limited thereto. In other embodiments, the control circuit can utilize the same method to compare the count values of the block corresponding to the write address with more threshold values and provide different second operation voltage groups conforming to different predetermined conditions to the access circuit.

As described previously, the control method of the disclosure provides different operation voltage groups when the number of times that the resistive memory performs the write operation is increased. For example, with an increase in the number of times that the resistive memory performs the write operation, the reset voltage group Vrst is reduced or the set voltage group Vset is increased. Therefore, the resistive memory has an obvious sense window and the degradation speed of the resistive memory is reduced simultaneously so that the endurance of the resistive memory is increased.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A resistive memory comprising:
a storage array comprising a plurality of blocks, each comprising a plurality of memory cells;
a storage circuit storing a plurality of count values;
a control circuit generating a control signal according to the count values when an external command is a write command;
a voltage generation circuit providing an operation voltage group according to the control signal; and
an access circuit accessing the storage array according to the operation voltage group,
wherein each of the count values indicates a number of times data is written from the access circuit to a corresponding block,
wherein when the external command is the write command, the control circuit compares the count value of the block corresponding to a write address with a first threshold value,
wherein when the count value of the block corresponding to the write address is lower than the first threshold value, the control circuit sets an electrical feature of the control signal to a first predetermined value, and
wherein when the count value of the block corresponding to the write address is higher than the first threshold value, the control circuit sets the electrical feature of the control signal to a second predetermined value.

2. The resistive memory as claimed in claim 1, further comprising:
a counter circuit adjusting the count value of the block that corresponds to the write address when the external command is the write command.

3. The resistive memory as claimed in claim 1, wherein the voltage generation circuit adjusts at least one voltage of the operation voltage group according to the control signal.

4. The resistive memory as claimed in claim 1, wherein the voltage generation circuit adjusts the duration of generation of the operation voltage group.

5. The resistive memory as claimed in claim 1, wherein when the external command is the write command, the access circuit reads original data stored in at least one memory cell corresponding to the write address, and
wherein the control circuit compares the original data and user data to generate a comparison result and adjusts the control signal according to the comparison result.

6. The resistive memory as claimed in claim 5, wherein the user data has a plurality of bits, the access circuit performs a set operation for a first memory cell group of the storage array according to the comparison result, and the access circuit performs a reset operation for a second memory cell group of the storage array according to the comparison result.

7. The resistive memory as claimed in claim 1, wherein when the count value of the block corresponding to the write address is higher than the first threshold value, the control circuit further compares the count value of the block corresponding to the write address with a second threshold value, wherein when the count value of the block corresponding to the write address is higher than the second threshold value, the control circuit sets the electrical feature of the control signal to a third predetermined value.

* * * * *